United States Patent
Choi et al.

(10) Patent No.: US 9,664,706 B2
(45) Date of Patent: May 30, 2017

(54) SEMICONDUCTOR CHIP TESTING APPARATUS FOR PICKING UP AND TESTING A SEMICONDUCTOR CHIP

(71) Applicants: SEMICORE Inc., Cheonan-si, Chungcheongnam-do (KR); NTS Co., Ltd, Cheonan-si, Chungcheongnam-do (KR); Amkor Technology Korea, Inc., Gwangju (KR)

(72) Inventors: Duk-Soon Choi, Cheonan-si (KR); In-Seol Hwang, Cheonan-si (KR); Woo-Yoel Jeong, Cheonan-si (KR); Seong-Han Park, Cheonan-si (KR); In-Seob Kwon, Incheon (KR); Dong-Shin Kim, Incheon (KR)

(73) Assignees: SEMICORE INC., Cheonan-si, Chungcheongnam-Do (KR); NTS CO., LTD, Cheonan-si, Chungcheongnam-Do (KR); AMKOR TECHNOLOGY KOREA, INC., Gwangju (KR)

(*) Notice: Subject to any disclaimer, the term of this patent is extended or adjusted under 35 U.S.C. 154(b) by 138 days.

(21) Appl. No.: 14/687,141

(22) Filed: Apr. 15, 2015

(65) Prior Publication Data

US 2016/0154023 A1    Jun. 2, 2016

(30) Foreign Application Priority Data

Nov. 28, 2014    (KR) ........................ 10-2014-0168633

(51) Int. Cl.
     *G01R 31/28*      (2006.01)
     *G01R 1/04*      (2006.01)

(52) U.S. Cl.
     CPC ........ *G01R 1/0466* (2013.01); *G01R 31/2891* (2013.01)

(58) Field of Classification Search
     CPC .................................................. G01R 31/2893
     (Continued)

(56) References Cited

U.S. PATENT DOCUMENTS 5,828,224 A * 10/1998 Maruyama
7,737,710 B2 * 6/2010 Cho
(Continued)

FOREIGN PATENT DOCUMENTS

| KR | 1020090005875 A | 1/2009 |
|---|---|---|
| KR | 101250890 B1 | 4/2013 |
| KR | 1020130071038 A | 6/2013 |

OTHER PUBLICATIONS

Korean Office Action dated May 27, 2015 in connection with the counterpart Korean Patent Application No. 10-2014-0168633.

*Primary Examiner* — Walter L Lindsay, Jr.
*Assistant Examiner* — Milton Gonzalez
(74) *Attorney, Agent, or Firm* — Hauptman Ham, LLP (57) ABSTRACT

A semiconductor chip testing apparatus is disclosed. The semiconductor chip testing apparatus includes: an upper socket unit which is formed therein with a receiving space receiving an upper semiconductor chip, holds a lower semiconductor chip using a suction airflow passing around the upper semiconductor chip in the receiving space, and electrically connects the lower semiconductor chip to the upper semiconductor chip; a blade block coupled to the upper socket unit to deliver a vacuum pressure for generating the suction airflow in the receiving space; and a lower socket unit on which the lower semiconductor chip held by the upper socket unit is seated, and which is electrically connected to the seated lower semiconductor chip.

6 Claims, 4 Drawing Sheets

(58) Field of Classification Search
USPC .......................... 324/750.2, 757.01, 757.04
See application file for complete search history.

(56) References Cited

U.S. PATENT DOCUMENTS 8,143,909 B2 * 3/2012 Ryu
9,423,451 B2 * 8/2016 Leung

\* cited by examiner

SEMICONDUCTOR CHIP TESTING APPARATUS FOR PICKING UP AND TESTING A SEMICONDUCTOR CHIP

CROSS REFERENCE TO RELATED APPLICATION

This application claims the benefit of Korean Patent Application No. 10-2014-0168633, filed on Nov. 28, 2014, entitled "SEMICONDUCTOR CHIP TESTING APPARATUS", which is hereby incorporated by reference in its entirety into this application.

FIELD OF THE INVENTION

The present invention relates to a semiconductor chip testing apparatus, and more particularly, to a semiconductor chip testing apparatus used in testing to detect defects of semiconductor chips.

DESCRIPTION OF THE RELATED ART

Generally, a semiconductor chip used in manufacture of electronics is subjected to testing to detect defects thereof, which can guarantee electrical properties and reliability of semiconductor chips.

A semiconductor chip testing apparatus used for testing includes a plate for mounting a semiconductor chip, a socket which is brought into contact with terminals of the semiconductor chip on one surface of the plate by pins, and a pushing unit which resiliently supports the semiconductor chip in a direction of the socket.

In this semiconductor chip testing apparatus, the pushing unit resiliently supports the semiconductor chip to be fixed at a certain location, and the socket sends/receives electric signals to/from the semiconductor chip.

Korean Patent Publication No. 10-2013-0071038 A (publication date: Jun. 28, 2013) discloses a socket for testing semiconductor chips.

SUMMARY OF THE INVENTION

It is one aspect of the present invention to provide a semiconductor chip testing apparatus which can effectively perform both picking and pushing of a semiconductor chip using a single apparatus without replacement of a blade block.

In accordance with one aspect of the present invention, a semiconductor chip testing apparatus includes: an upper socket unit which is formed therein with a receiving space receiving an upper semiconductor chip, holds a lower semiconductor chip using a suction airflow passing around the upper semiconductor chip in the receiving space, and electrically connects the lower semiconductor chip to the upper semiconductor chip; a blade block which is coupled to the upper socket unit to deliver a vacuum pressure for generating the suction airflow in the receiving space; and a lower socket unit on which the lower semiconductor chip held by the upper socket unit is seated, and which is electrically connected to the lower semiconductor chip seated on the lower socket unit.

The upper socket unit may include: a socket body connected at one side thereof to the blade block to receive the vacuum pressure from the blade block, and formed at the other side thereof with a concave groove portion; a socket block coupled to the other side of the socket body at which the groove portion is formed; a substrate received in the receiving space surrounded by the groove portion and the socket block, and on one side of which the upper semiconductor chip is mounted to be placed within the receiving space; a pogo pin passing through the socket block to electrically connect the substrate to the lower semiconductor chip; and a suction nozzle disposed in the socket block and holding the lower semiconductor chip using the suction airflow flowing through the receiving space.

The blade block may be formed therethrough with a first suction hole; the socket body may be formed therethrough with a second suction hole at one side thereof, the first suction hole communicating with the receiving space through the second suction hole; the socket block may be formed therethrough with a third suction hole through which the receiving space communicates with the suction nozzle; and the suction airflow may flow through the upper socket unit along a flow path formed by sequentially connecting the suction nozzle, the third suction hole, the receiving space, the second suction hole, and the first suction hole to generate suction force allowing the suction nozzle to hold the lower semiconductor chip.

The groove portion may include: a connection groove concavely formed at the other side of the socket body to form a step such that an edge of the socket block is seated to be coupled to the other side of the socket body; a substrate receiving groove, which is concavely formed inside the connection groove to form a step, allows the substrate to be received in a receiving space therein with a space between an inner surface of the socket body and an outer surface of the substrate, and communicates with the third suction hole; and a chip receiving groove which is concavely formed inside the substrate receiving groove to form a step, allows the upper semiconductor chip to be received a receiving space therein with a space between an inner surface of the socket body and an outer surface of the upper semiconductor chip, and communicates with the second suction hole.

The upper socket unit may further include a pushing projection protruding from a lower surface of the socket body with the chip receiving groove formed therein and pushing the upper semiconductor chip toward the socket block.

Plural pushing projections may be provided and arranged apart from one another along an edge of the upper semiconductor chip between the lower surface of the socket body and the upper semiconductor chip; and the flow path may be formed through connection of the third suction hole to the receiving space within the substrate receiving groove through the space between the socket block and the substrate, connection of the receiving space within the substrate receiving groove to the receiving space within the chip receiving groove through the space between the inner surface of the socket body and the outer surfaces of the substrate and the upper semiconductor chip, and connection of the receiving space within the chip receiving groove through a space between the plural pushing projections.

The pogo pin may include a barrel passing through the socket block and a plunger disposed on the barrel to be movable in a longitudinal direction of the barrel; and the socket block may include a top plate coupled to the other side of the socket body and formed therethrough with a first pin insertion hole for insertion of the plunger in a moving direction of the plunger, and a pin block coupled to the other side of the top plate and formed therethrough with a second pin insertion hole for insertion of the barrel.

The top plate may be formed with a guide groove allowing the substrate to be seated therein at one side thereof facing the socket body; and the plunger may protrude outward from the guide groove to support the substrate such that a space is formed between the substrate and the guide groove.

In accordance with another aspect of the present invention, a semiconductor chip testing apparatus includes: an upper socket unit which is formed therein with a receiving space receiving an upper semiconductor chip, holds a lower semiconductor chip using a suction airflow passing around the upper semiconductor chip in the receiving space, and electrically connects the lower semiconductor chip to the upper semiconductor chip; a blade block coupled to the upper socket unit and formed therethrough with a first suction hole to deliver a vacuum pressure for generating the suction airflow in the receiving space; and a lower socket unit on which the lower semiconductor chip held by the upper socket unit is seated, and which is electrically connected to the seated lower semiconductor chip, wherein the upper socket unit includes: a socket body which is connected to the blade block at one side thereof, formed therethrough with a second suction hole at the other side thereof to receive the vacuum pressure from the blade block through the first suction hole communicating with the receiving space through the second suction hole, and formed at the other side thereof with a concave groove portion; a socket block which is coupled to the other side of the socket body at which the groove portion is formed, and formed therethrough with a third suction hole communicating with the receiving space; a substrate received in the receiving space surrounded by the groove portion and the socket block, and on one side of which the upper semiconductor chip is mounted to be placed within the receiving space; a plurality of pushing projections protruding from a lower surface of the socket body to push the upper semiconductor chip toward the socket block, and arranged apart from one another along an edge of the upper semiconductor chip between the lower surface of the socket body and the upper semiconductor chip; a pogo pin passing through the socket block to electrically connect the substrate and the lower semiconductor chip; and a suction nozzle disposed in the socket block to communicate with the third suction hole and holding the lower semiconductor chip using the suction airflow flowing through the receiving space, wherein the socket block is formed with a guide groove allowing the substrate to be seated therein at one side thereof facing the socket body; the pogo pin protrudes outward from the guide groove to support the substrate such that a space is formed between the substrate and the guide groove; and the flow path is formed through connection of the third suction hole to the receiving space within the substrate receiving groove through the space between the guide groove and the substrate, connection of the receiving space within the substrate receiving groove to the receiving space within the chip receiving groove through the space between the inner surface of the socket body and the outer surfaces of the substrate and the upper semiconductor chip, connection of the receiving space within the chip receiving groove through a space between the plural pushing projections, connection of the receiving space within the chip receiving groove to the second suction hole, and connection of the second suction hole to the first suction hole.

In the semiconductor chip testing apparatus according to the present invention, the upper socket unit is formed with a flow path, through which a suction airflow generating suction force for holding the lower semiconductor chip can act, whereby both picking and pushing of the lower semiconductor chip can be effectively performed using a single apparatus without replacement of the blade block, with the upper semiconductor chip mounted therein.

In addition, the semiconductor chip testing apparatus according to the present invention allows both picking and pushing of the lower semiconductor chip to be effectively performed using a single apparatus without replacement of the blade block, with the upper semiconductor chip mounted therein, whereby testing of semiconductor chips can be considerably simplified.

Further, the semiconductor chip testing apparatus according to the present invention can suppress increase in temperature around the upper semiconductor chip and within the upper socket unit during testing of the lower semiconductor chip using the suction airflow flowing through the upper socket unit, thereby preventing deterioration in test performance due to increased temperature.

DETAILED DESCRIPTION OF THE INVENTION

Hereinafter, embodiments of the present invention will be described in detail with reference to the accompanying drawings. It should be understood that the drawings are not to precise scale and some of the dimensions, such as width, length, thickness, and the like, are exaggerated for clarity and convenience of description. Further, the terms used herein are defined by taking functions of the present invention into account and can be changed according to user or operator custom or intention. Therefore, definition of the terms should be made according to the overall disclosure set forth herein.

Figure 1:
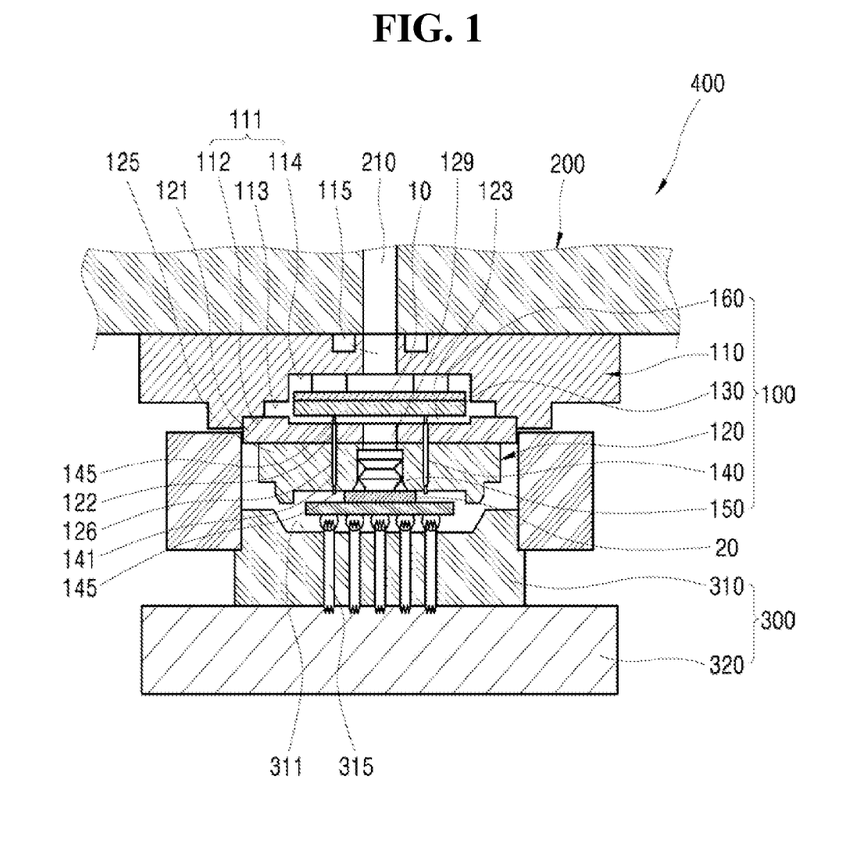
FIG. 1 is a sectional view of a semiconductor chip testing apparatus according to one embodiment of the present invention.
Figure 2:
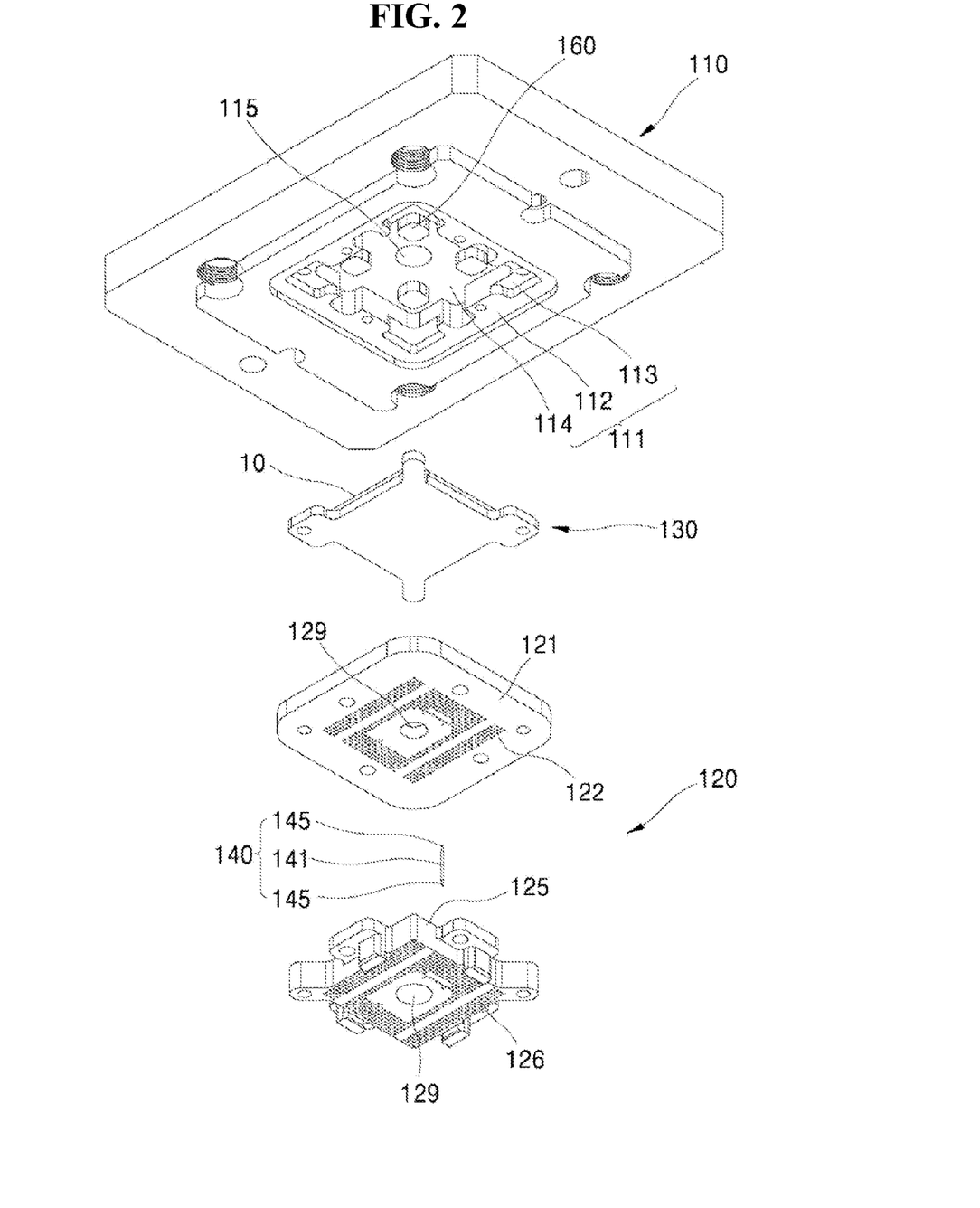
FIG. 2 is a partially exploded perspective view of the semiconductor chip testing apparatus according to one embodiment of the present invention.

FIG. 1 is a sectional view of a semiconductor chip testing apparatus according to one embodiment of the present invention and FIG. 2 is a partially exploded perspective view of the semiconductor chip testing apparatus according to the embodiment of the present invention.

Referring to FIGS. 1 and 2, the semiconductor chip testing apparatus according to one embodiment of the present invention includes an upper socket unit 100, a blade block 200, and a lower socket unit 300.

The upper socket unit 100 serves as a main body, which receives an upper semiconductor chip 10 and holds a lower semiconductor chip 20. The upper socket unit 100 has a receiving space defined therein to receive the upper semiconductor chip 10.

The upper socket unit 100 holds the lower semiconductor chip 20 using suction force generated by a suction airflow passing around the upper semiconductor chip 10 in the receiving space. In addition, the upper socket unit 100 serves to electrically connect the lower semiconductor chip 20 held thereby to the upper semiconductor chip 10.

The upper socket unit 100 is coupled to the blade block 200. The blade block 200 is configured to be displaceable in vertical and horizontal directions. The upper socket unit 100 coupled to the blade block 200 is also displaceable together with the blade block 200.

In addition, the blade block 200 is connected at one side thereof to an external vacuum generator (not shown) that generates a vacuum pressure. The blade block 200 is formed therethrough with a first suction hole 210 at one side thereof connected to the vacuum generator.

The first suction hole 210 formed through the blade block 200 at one side thereof is connected to the vacuum generator connected to one side of the blade block 200 to form a passage for delivering a vacuum pressure from the vacuum generator to the upper socket unit 100.

According to this embodiment, the upper socket unit 100 includes a socket body 110, a socket block 120, a substrate 130, a pogo pin 140, and a suction nozzle 150.

The socket body 110 is coupled to the blade block 200 to be displaceable with the location change of the blade block 200. The socket body 110 is connected at one side thereof to the blade block 200 to receive the vacuum pressure from the blade block 200, and is formed at the other side thereof with a concave groove portion 111.

The receiving space receiving the upper semiconductor chip 10 is formed in the socket body 110 having the groove portion 111. By way of example, in this embodiment, the groove portion 111 includes a connection groove 112, a substrate receiving groove 113, and a chip receiving groove 114. Specific features and shape of the groove portion 111 will be described later.

In addition, the socket body 110 is formed therethrough with a second suction hole 115 at one side thereof. The second suction hole 115 allows the first suction hole 210 to communicate with the receiving space within the socket body 110 to form a passage for delivering the vacuum pressure to the receiving space at one side of the socket body 110, the vacuum pressure generating the suction airflow in the receiving space.

The socket block 120 is connected to the other side of the socket body 110 at which the groove portion 111 is formed. The socket block 120 serves as a cover covering the other side of the socket body 110 and as a fixing block fixing the substrate 130 and the pogo pin 140. Specific features and functions of the socket block 120 are described below.

The substrate 130 is received in the receiving space formed by the surrounding groove portion 111 and socket block 120. On one side of the substrate 130, the upper semiconductor chip 10 is mounted to be placed in the receiving space and electrically connected to the substrate 130. By way of example, in this embodiment, the substrate 130 is a printed circuit board with circuit patterns formed on both surfaces thereof.

The pogo pin 140 passes through the socket block 120. The pogo pin 140 electrically connects the substrate 130 to the lower semiconductor chip 20 held by the upper socket unit 100.

According to this embodiment, the pogo pin 140 includes a barrel 141 and a plunger 145. The barrel 141 passes through the socket block 120. The plunger is disposed on the barrel 141 to be movable in a longitudinal direction of the barrel 141 and has a smaller width than the barrel 141.

Here, the barrel 141 is provided with the plungers 145 at opposite sides in the longitudinal direction thereof, respectively. Each plunger 145 is resiliently supported on the barrel 141 to push a surface brought into contact with the plunger 145.

The socket block 120 provided with the substrate 130 and the pogo pin 140 includes a top plate 121 and a pin block 125.

The top plate 121 is coupled to the other side of the socket body 110 at which the groove portion 111 is formed. The top plate 121 is formed therethrough with a first pin insertion hole 122 for insertion of the plunger 145 along a moving direction of the plunger 145.

The first pin insertion hole 122 formed in the top plate 121 may have a smaller width than a second pin insertion hole 122 described below so as to only allow the plunger 145 having a smaller width than the barrel 141 to be inserted thereinto and passed therethrough, without allowing insertion and passage of the barrel 141.

In addition, the top plate 121 is formed with a concave guide groove 123 at one side thereof facing the socket body 110. The substrate 130 is seated on the guide groove 123 at a predetermined distance from the guide groove 123, with the substrate supported by the pogo pin 140.

In this embodiment, the plunger 145 of the pogo pin 140 passes through the top plate 121 through the first pin insertion hole 122 protrudes outward from the guide groove 123 to be brought into contact with the substrate 130, and supports the substrate 130 such that a space is formed between the substrate 130 and the guide grove 123.

The pin block 125 is coupled to the other side of the top plate 121 and is formed therethrough with a second pin insertion hole 126 for insertion of the barrel 141.

In other words, the pin block 125 is configured to allow the barrel 141 to be inserted thereinto and fixed thereto, and the top plate 121 is configured to allow the plunger 145 at one side of the barrel 141 to be inserted thereinto and pass therethrough.

In addition, the socket block 120, more particularly, the top plate 121, is formed therethrough with a third suction hole 129 which allows the receiving space formed by the surrounding groove portion 111 and socket block 120 to communicate with the suction nozzle 150.

The suction nozzle 150 is mounted in a mounting hole (numeral omitted) formed inside the socket block 120, more particularly, the pin block 125, to pass therethrough so as to communicate with the third suction hole 129. The suction nozzle 150 is configured to hold the lower semiconductor chip 20 using the suction airflow passing through the receiving space.

A flow route and functions of the suction airflow by which the suction nozzle 150 holds the lower semiconductor chip 20 will be further described below.

As described above, the groove portion 111 forming the receiving space within the socket body 110 includes the connection groove 112, the substrate receiving groove 113, and the chip receiving groove 114.

The connection groove 112 is concavely formed at the other side of the socket body 110 to form a step. An edge of the socket block 120, more particularly, of the top plate 121 coupled to the other side of the socket body 110, is seated on the connection groove 112.

In other words, the socket block 120 is coupled to the socket body 110 though coupling between the top plate 121 and the socket body 110, and the connection groove 112 guides the top plate 121 coupled to the socket body 110 to be seated in place.

The substrate receiving groove 113 is concavely formed inside the connection groove 112 to form a step. The substrate 130 is received in a receiving space formed in the substrate receiving groove 113, with a space between an outer surface of the substrate 130 and an inner surface of the socket body 110.

The receiving space formed in the substrate receiving groove 113 to receive the substrate 130 communicates with the third suction hole 129 formed in the top plate 121.

The chip receiving groove 114 is concavely formed inside the substrate receiving groove 113 to form a step. The upper semiconductor chip 10 is received in a receiving space formed in the chip receiving groove 114. In addition, a space is formed between an outer surface of the upper semiconductor chip 10 and an inner surface of the socket body 110.

The receiving space formed in the chip receiving groove 114 to receive the upper semiconductor chip 10 communicates with the second suction hole 129 formed in the socket body 110.

In other words, the second suction hole 115 and the third suction hole 129 communicate with each other through the receiving spaces formed in the substrate receiving groove 113 and the chip receiving groove 114.

The upper socket unit 100 according to this embodiment may further include a pushing projection 160. The pushing projection 160 protrudes from a lower surface of the socket body 110 having the chip receiving groove 114 to push the upper semiconductor chip 10 in the chip receiving groove 114 toward the socket block 120.

According to this embodiment, the pushing projection 160 is provided in plural, and the plural pushing projections 160 are arranged apart from one another along an edge of the upper semiconductor chip 10 between the lower surface of the socket body 110 and the upper semiconductor chip 10. Thus, a space allowing the suction airflow to pass therethrough is formed between the plural pushing projections 160.

The upper socket unit 100 holds the lower semiconductor chip 20 via the suction nozzle 150, with the upper semiconductor chip 10 received therein, to electrically connect the upper semiconductor chip 10 to the lower semiconductor chip 20.

The lower semiconductor chip 20 held by the upper socket unit 100 and electrically connected to the upper semiconductor chip 10 is connected to the lower socket unit 300.

The lower socket unit 300 is placed below the upper socket unit 100. The lower semiconductor chip 20 held by the upper socket unit 100 is seated on the lower socket unit 300. The lower semiconductor chip 20 seated on the lower socket unit 300 is electrically connected to the lower socket unit 300.

By way of example, in this embodiment, the lower socket unit 300 includes an input terminal block 310 and a test board block 320.

The input terminal block 310 is disposed between the upper socket unit 100 and the test board block 320 to electrically connect the test board block 320 and the lower semiconductor chip 20 held by the upper socket unit 100 to each other.

The input terminal block 310 is formed at one side thereof facing the upper socket unit 100 with a seat groove 311 on which the pin block 125 of the socket block 120 and the lower semiconductor chip 20 are seated. The seat groove 311 is concavely formed, corresponding to a shape of the pin block 125.

Preferably, an outer surface of the pin block 125 and an inner surface of the seat groove 311, adjoining each other, are formed at an angle so as to guide the pin block 125 moving toward the seat groove 311 to be stably seated.

In addition, the input terminal block 310 is provided with a plurality of pogo pins 315 corresponding to terminals formed on the lower semiconductor chip 20. The pogo pin 315 is inserted into the input terminal block 310 and fixed thereto. At one side thereof, the pogo pin 315 protrudes onto the lower semiconductor chip 20 to be electrically connected to the lower semiconductor chip 20, whereas, at the other side thereof, the pogo pin 315 protrudes onto the test board block 320 to be electrically connected to the test board block 320.

Thus, the lower semiconductor chip 20 and the test board block 320 are electrically connected to each other via the pogo pin 315.

Since specific features of the pogo pin 315 are the same as or similar to those of the pogo pin 140 of the upper socket unit 100 as described above, a detailed description thereof will be omitted.

As described above, the test board block 320 is electrically connected to the input terminal block 310 to be electrically connected to the upper semiconductor chip 10 and the lower semiconductor chip 20.

According to this embodiment, the test board block 320 is electrically connected to semiconductor chip testing equipment (not shown). The test board block 320 transfers electric signals for testing semiconductor chips to the lower semiconductor chip 20 via the input terminal block 310, and sends, to the semiconductor chip testing equipment, electric signals which the lower semiconductor chip 20 generates in response to the electric signals for testing semiconductor chips.

Figure 3:
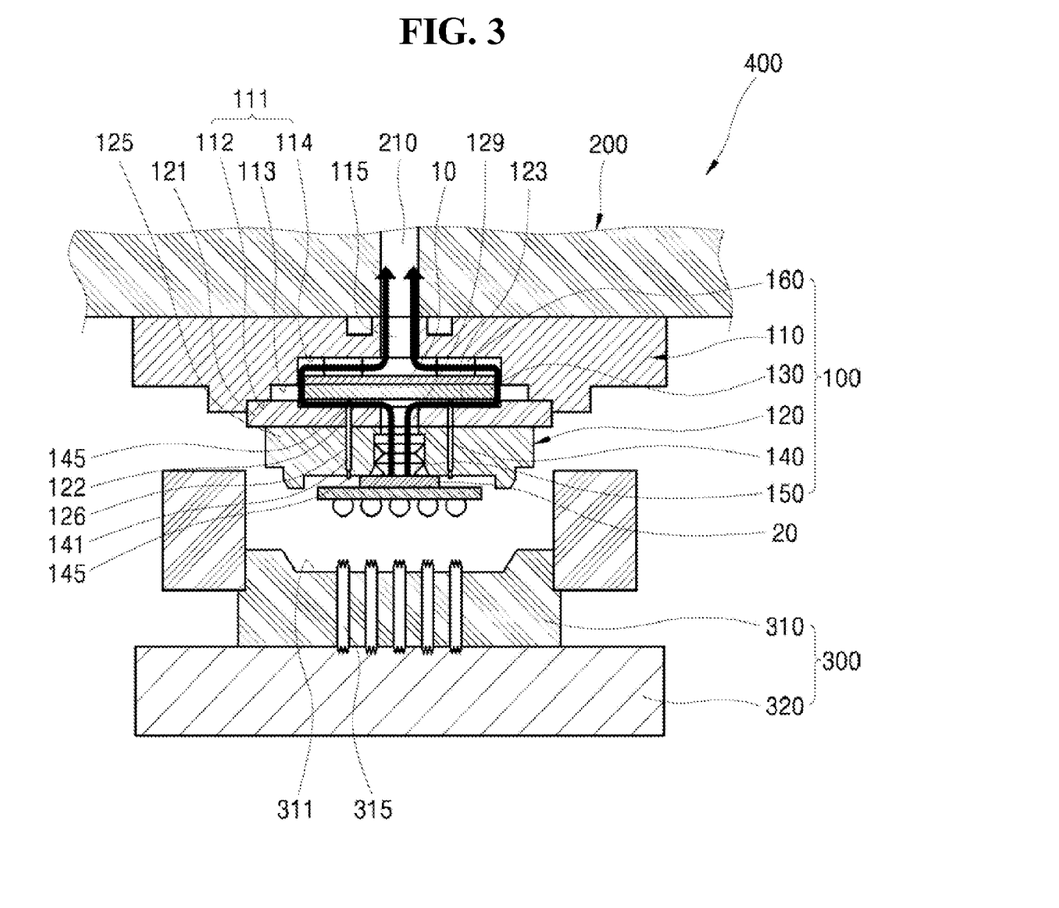
FIG. 3 is a view showing a picking operation of the semiconductor chip testing apparatus according to one embodiment of the present invention.
Figure 4:
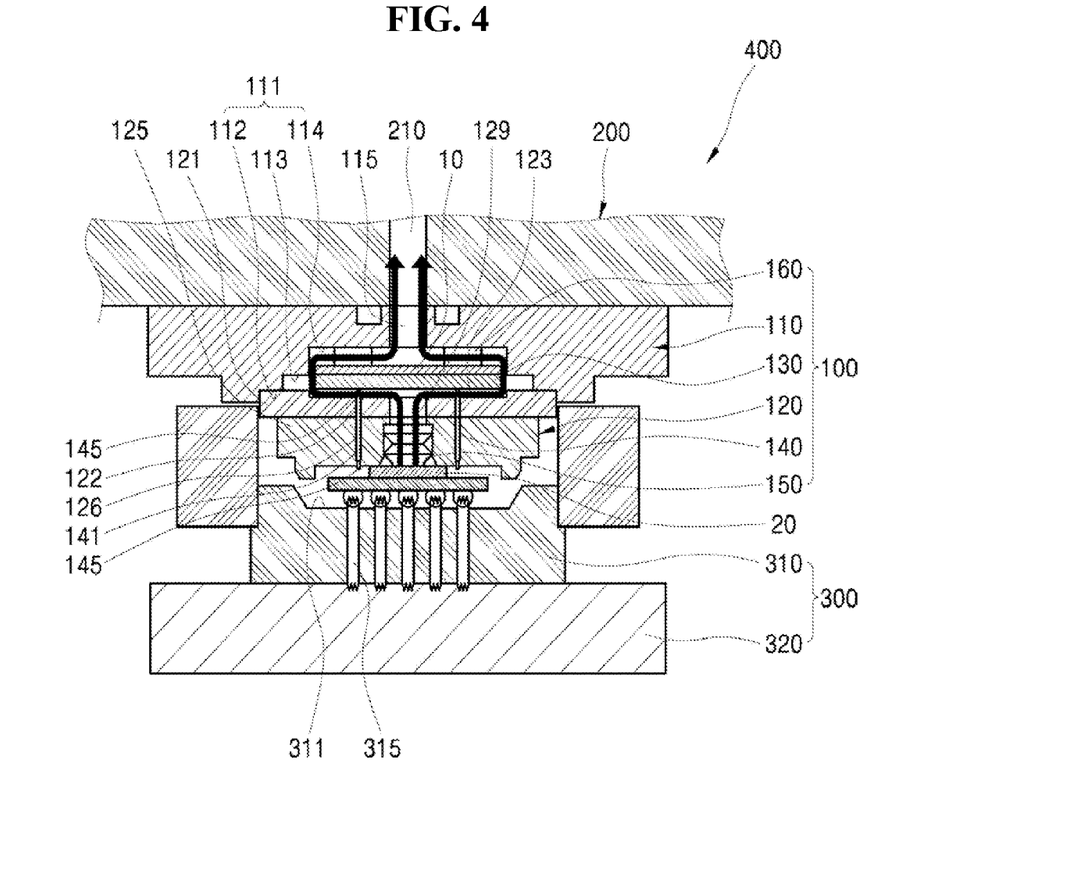
FIG. 4 is a view showing pushing and testing operations of the semiconductor chip testing apparatus according to one embodiment of the present invention.

FIG. 3 is a view showing a picking operation of the semiconductor chip testing apparatus according to the present invention, and FIG. 4 is a view showing pushing and testing operations of the semiconductor chip testing apparatus according to the present invention.

Hereinafter, functions and effects of the semiconductor chip testing apparatus according to the invention will be described with reference to FIGS. 1 to 4.

Referring to FIGS. 1 and 2, in the semiconductor chip testing apparatus 400 according to the invention, after the upper semiconductor chip 10 is mounted within the upper socket unit 100, and the lower semiconductor chip 20 is picked such that the upper semiconductor chip 10 and the lower semiconductor chip 20 are electrically connected to each other, testing of the lower semiconductor chip 20 is conducted.

In other words, the lower semiconductor chip 20 is a main target of performance verification testing, whereas the upper semiconductor chip 10 is an ancillary component prepared for this testing.

With the upper semiconductor chip 10 mounted within the upper socket unit 100, picking of the lower semiconductor chip 20 may be accomplished by the suction airflow which is generated in the receiving space within the upper socket unit 100 by the vacuum pressure acting on the upper socket unit 100 via the blade block 200 connected to the vacuum generator. Hereinafter, a detailed description thereof will be given.

As shown in FIG. 3, with the upper socket unit 100 displaced to a location for picking the lower semiconductor chip 20 to be tested by movement of the blade block 200, a vacuum pressure is generated by the vacuum generator. The vacuum pressure acts on the receiving space within the upper socket unit 100 via the first suction hole 210 formed in the blade block 200 and the second suction hole 115 formed in the socket body 110.

As a result, a suction airflow is produced in the receiving space by the vacuum pressure. The suction airflow flows along a flow path formed in the receiving space, thereby providing suction force for holding the lower semiconductor chip 20. The flow path through which the suction airflow flows is formed in the receiving space according to the following route.

The flow path is formed by sequential connection of a flow path in a first section wherein the third suction hole 129 is connected to the receiving space within the substrate receiving groove 113 through the space between the guide groove 123 of the socket block 120, more specifically, of the top plate 121 and the substrate 130; a flow path in a second section wherein the receiving space within the substrate receiving groove 113 is connected to the receiving space within the chip receiving groove 114 through the space between an inner surface of the socket body 110 and outer surfaces of the substrate 130 and the upper semiconductor chip 10; a flow path in a third section wherein the receiving space within the chip receiving groove 114 is connected through the space between the plurality of pushing projections 160; and a flow path in a fourth section wherein the receiving space within the chip receiving groove 114 connected as described above is connected to the vacuum generator through the second suction hole 115 and the first suction hole 210.

The suction airflow flowing along the flow path formed as described above acts on as a stream passing around the upper semiconductor chip 10 in the receiving space within the upper socket unit 100, with the upper semiconductor chip 10 mounted within the receiving space within the upper socket unit 100.

Such an action of the suction flow allows suction force capable of holding the lower semiconductor chip 20 to act through the suction nozzle 150. This suction force acting through the suction nozzle 150 causes the lower semiconductor chip 20 to be held by the upper socket unit 100, whereby picking of the lower semiconductor chip 20 is accomplished.

Since the flow path allowing the suction airflow to act therethrough is formed within the upper socket unit 100, as described above, the semiconductor chip testing apparatus 400 according to the present invention allows the lower semiconductor chip 20 to be picked without replacement of the blade block 200, with the upper semiconductor chip 10 mounted within the upper socket unit 100.

After picking of the lower semiconductor chip 20 as described above, pushing for moving the upper socket unit 100 onto the lower socket unit 300 is performed, as shown in FIG. 4.

Pushing may be accomplished by moving the blade block 200 such that the upper socket unit 100 is displaced to a location at which the upper socket unit 100 and the lower socket unit 300 are connected to each other.

Once pushing is completed and thus the upper socket unit 100 and the lower socket unit 300 are connected to each other, the upper semiconductor chip 10 mounted within the upper socket unit 100, the lower semiconductor chip 20 held by a lower portion of the upper socket unit 100, and the test board block 320 of the lower socket unit 300 are electrically connected to one another.

When this connection is accomplished, testing of the lower semiconductor chip 20 may be conducted using the semiconductor chip testing equipment connected to the test board block 320.

On the other hand, the suction airflow acting to produce the suction force for holding the lower semiconductor chip 20 can continuously flow along the flow path formed in the upper socket unit 100 during testing of the lower semiconductor chip 20.

The suction airflow flowing through the upper socket unit 100 can discharge heat generated around the upper semiconductor chip 10 and within the upper socket unit 100 during testing of the lower semiconductor chip 20, while continuously passing around the upper semiconductor chip 10 mounted within the upper socket unit 100.

In other words, with the suction airflow flowing through the upper socket unit 100, it is possible to suppress increase in temperature around the upper semiconductor chip 10 and within the upper socket unit 100 during testing of the lower semiconductor chip 20, thereby preventing deterioration in test performance.

The semiconductor chip testing apparatus 400 according to the present invention is formed inside the upper socket unit 100 with the flow path through which the suction airflow generating the suction force for holding the lower semiconductor chip can act, whereby both picking and pushing of the lower semiconductor chip 20 can be effectively performed using a single apparatus without replacement of the blade block 200, with the upper semiconductor chip 10 mounted therein.

In addition, since the semiconductor chip testing apparatus 400 according to the present invention allows both picking and pushing of the lower semiconductor chip 20 to be effectively performed using a single apparatus without replacement of the blade block 200, with the upper semiconductor chip 10 mounted therein, testing of semiconductor chips can be considerably simplified.

Further, since the semiconductor chip testing apparatus 400 according to the present invention can suppress increase in temperature around the upper semiconductor chip 10 and within the upper socket unit 100 during testing of the lower semiconductor chip 20 using the suction airflow flowing through the upper socket unit 100, it is possible to prevent deterioration in test performance due to increased temperature.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the invention. The scope of the present invention should be defined by the appended claims and equivalents thereof.

LIST OF REFERENCE NUMERALS

10: Upper semiconductor chip
20: Lower semiconductor chip
100: Upper socket unit
110: Socket body
111: Groove portion
112: Connection groove
113: Substrate receiving groove
114: Chip receiving groove
115: Second suction hole
120: Socket block
121: Top plate
122: First pin insertion hole
123: Guide groove
125: Pin block
126: Second pin insertion hole
129: Third suction hole 130: Substrate
140, 315: Pogo pin
141: Barrel
145: Plunger
150: Suction nozzle
160: Pushing projections
200: Blade block
210: First suction hole
300: Lower socket unit
310: Input terminal block
311: Seat groove
320: Test board block
400: Semiconductor chip testing apparatus.

What is claimed is:

1. A semiconductor chip testing apparatus for picking up and testing semiconductor chips, the apparatus comprising:
an upper socket unit having a receiving space defined therein to receive an upper semiconductor chip, the upper socket unit configured to
pick up a lower semiconductor chip using a suction airflow passing around the received upper semiconductor chip in the receiving space, and
electrically connect the picked lower semiconductor chip to the received upper semiconductor chip;
a blade block coupled to the upper socket unit and configured to deliver a vacuum pressure for generating the suction airflow in the receiving space; and
a lower socket unit configured to
receive the picked lower semiconductor chip to be seated on the lower socket unit,
be electrically connected to the seated lower semiconductor chip, and
transfer, from a semiconductor chip testing equipment, an electric signal for testing to the seated lower semiconductor chip,
wherein the upper socket unit comprises
a socket body comprising a top side coupled to the blade block to receive the vacuum pressure from the blade block, and a bottom side having a concave groove portion forming the receiving space,
a socket block coupled to the bottom side of the socket body,
a substrate provided between the socket body and the socket block, placed in the receiving space surrounded by the concave groove portion and the socket block, and configured to receive the upper semiconductor chip on the substrate in order to place the received upper semiconductor chip in the receiving space,
a pogo pin passing through the socket block to electrically connect the substrate, which is electrically connected with the received upper semiconductor chip, to the picked lower semiconductor chip, and
a suction nozzle coupled to the socket block and configured to pick up the lower semiconductor chip using the suction airflow flowing through the receiving space,
wherein the blade block comprises a first suction hole,
wherein the socket body comprises a second suction hole formed in the concave groove portion and passing through the top side and the concave groove portion of the bottom side,
wherein the socket block comprises a third suction hole connected to the suction nozzle,
wherein a flow path for the suction airflow through the upper socket unit is defined by a sequential connection of the suction nozzle, the third suction hole, the receiving space, the second suction hole, and the first suction hole, to generate a suction force allowing the suction nozzle to pick up the lower semiconductor chip, and
wherein the concave groove portion comprises
a connection groove concavely formed at the bottom side of the socket body to form a first portion of the receiving space with a first step such that an edge of the socket block is placed in the connection groove,
a substrate receiving groove concavely formed inside the connection groove to form a second portion of the receiving space with a second step, wherein the substrate receiving groove allows the substrate to be received in the receiving space with a first space between the second step and an outer edge of the received substrate, and communicates with the third suction hole, and
a chip receiving groove concavely formed inside the substrate receiving groove to form a third portion of the receiving space with a third step, wherein the chip receiving groove allows the upper semiconductor chip to be received in the receiving space with a second space between the third step and an outer edge of the upper semiconductor chip, and communicates with the second suction hole formed in the chip receiving groove.

2. The apparatus according to claim 1, wherein the upper socket unit further comprises a plurality of pushing projections protruded from a lower surface of the socket body to push the upper semiconductor chip toward the socket block.

3. The apparatus according to claim 2, wherein
the plurality of pushing projections are arranged apart from one another along the outer edge of the upper semiconductor chip, and
the flow path is formed through
a connection of the third suction hole to the first portion of the receiving space within the substrate receiving groove through the first space,
a connection of the second portion of the receiving space within the substrate receiving groove to the third portion of the receiving space within the chip receiving groove through the second space, and
a connection of the third portion of the receiving space within the chip receiving groove through a third space between the plurality of pushing projections.

4. The apparatus according to claim 1, wherein
the pogo pin comprises a barrel passing through the socket block and a plunger disposed on the barrel to be movable in a longitudinal direction of the barrel, and
the socket block comprises
a top plate coupled to the bottom side of the socket body by one side of the top plate and formed therethrough with a first pin insertion hole for insertion of the plunger in a moving direction of the plunger, and
a pin block coupled to the other side of the top plate and formed therethrough with a second pin insertion hole for insertion of the barrel.

5. The apparatus according to claim 4, wherein
the top plate is formed with a guide groove allowing the substrate to be seated therein at the one side facing the socket body, and
the plunger protrudes outward from the guide groove to support the substrate in order to form a space between the substrate and the guide groove.

6. A semiconductor chip testing apparatus for picking up and testing a semiconductor chip, the apparatus comprising:

an upper socket unit formed therein with a receiving space for receiving an upper semiconductor chip, the upper socket unit configured to
- pick up a lower semiconductor chip using a suction airflow passing around the received upper semiconductor chip in the receiving space, and
- electrically connect the picked lower semiconductor chip to the received upper semiconductor chip;

a blade block coupled to the upper socket unit and formed therethrough with a first suction hole, the blade block configured to deliver a vacuum pressure for generating the suction airflow in the receiving space; and a lower socket unit configured to
- receive the picked lower semiconductor chip to be seated on the lower socket unit,
- be electrically connected to the seated lower semiconductor chip, and
- transfer, from a semiconductor chip testing equipment, an electric signal for testing to the seated lower semiconductor chip, wherein the upper socket unit comprises,
- a socket body having a top side coupled to the blade block to receive the vacuum pressure from the blade block and a bottom side having a concave groove portion forming the receiving space, and comprising a second suction hole formed in the concave groove portion to transfer the vacuum pressure from the blade block through the first suction hole to the receiving space,
- a socket block coupled to the bottom side of the socket body, and comprising a third suction hole to communicate with the receiving space;
- a substrate provided in the receiving space surrounded by the concave groove portion and the socket block, and configured to receive the upper semiconductor chip on the substrate in order to place the received upper semiconductor chip in the receiving space,
- a plurality of pushing projections protruded from a lower surface of the socket body to push the upper semiconductor chip toward the socket block and arranged apart from one another along an outer edge of the upper semiconductor chip;
- a pogo pin passing through the socket block to electrically connect the substrate and the picked lower semiconductor chip; and
- a suction nozzle coupled to the socket block to communicate with the third suction hole and configured to pick up the lower semiconductor chip using the suction airflow flowing through the third suction hole, wherein the concave groove portion comprises,
- a connection groove concavely formed at the bottom side of the socket body to form a first portion of the receiving space with a first step such that an edge of the socket block is placed in the connection groove,
- a substrate receiving groove concavely formed inside the connection groove to form a second portion of the receiving space with a second step, wherein the substrate receiving groove allows the substrate to be received in the receiving space with a first space between the second step and an outer edge of the substrate, and communicates with the third suction hole, and
- a chip receiving groove concavely formed inside the substrate receiving groove to form a third portion of the receiving space with a third step, wherein the chip receiving groove allows the upper semiconductor chip to be received in the receiving space with a second space between the third step and an outer edge of the upper semiconductor chip, and communicates with the second suction hole formed in the chip receiving groove, wherein the socket block is formed with a guide groove allowing the substrate to be seated therein at one side facing the socket body, and the pogo pin protrudes outward from the guide groove to support the substrate in order to form a third space between the substrate and the guide groove, and wherein the flow path is formed through a connection of the third suction hole to the first portion of the receiving space within the substrate receiving groove through the first space, a connection of the second portion of the receiving space within the substrate receiving groove to the third portion of the receiving space within the chip receiving groove through the second space, a connection of a fourth portion of the receiving space within the chip receiving groove through a fourth space between the plurality of pushing projections, a connection of the third portion of the receiving space within the chip receiving groove to the second suction hole, and a connection of the second suction hole to the first suction hole.

* * * * *